United States Patent [19]

Kitagawa et al.

[11] Patent Number: 4,972,378
[45] Date of Patent: Nov. 20, 1990

[54] NONVOLATILE MEMORY CIRCUIT DEVICE PERFORMING STABLE OPERATION IN WIDE RANGE OF POWER SOURCE VOLTAGE LEVEL

[75] Inventors: Nobutaka Kitagawa, Kawasaki; Makoto Ito, Yokohama, both of Japan

[73] Assignee: Kabushiki Kaisha Toshiba, Kawasaki, Japan

[21] Appl. No.: 368,652

[22] Filed: Jun. 20, 1989

[30] Foreign Application Priority Data

Jun. 24, 1988 [JP] Japan ................................ 63-156462

[51] Int. Cl.⁵ ............................................. G11C 17/00
[52] U.S. Cl. .................................. 365/210; 365/185; 365/203; 365/205
[58] Field of Search ................ 365/210, 185, 104, 203, 365/204, 205, 230.03, 189.09

[56] References Cited

U.S. PATENT DOCUMENTS

4,458,348 7/1984 Fukuda et al. ........................ 365/185
4,611,301 9/1986 Iwahashi et al. ................ 365/104 X Primary Examiner—Joseph A. Popek
Attorney, Agent, or Firm—Finnegan, Henderson, Farabow, Garrett, and Dunner

[57] ABSTRACT

An electrically programmable nonvolatile memory circuit device includes a plurality of memory cell transistors from which data is read out, dummy cell transistors which are each selectively operated at the same time as the operation of a selected one of said memory cell transistors in the same condition as the selected memory cell transistor at the time of reading out data from the selected memory cell transistor, and a sense amplifier including a logic gate circuit for converting the programming state of the memory cell transistor into a logic value based on a difference between the current characteristics of the memory cell transistor and the dummy cell transistor. When the source-drain current of the memory cell transistors set in the non-programmed state is denoted by I1, the source-drain current of the dummy cell transistor is denoted by I2, and the source-drain current of the memory cell transistors set in the programmed state is denoted by I3, then currents I1, I2 and I3 are so set as to satisfy the current relation of "I1>I2>I3".

14 Claims, 8 Drawing Sheets

NONVOLATILE MEMORY CIRCUIT DEVICE PERFORMING STABLE OPERATION IN WIDE RANGE OF POWER SOURCE VOLTAGE LEVEL

BACKGROUND OF THE INVENTION

1. Field of the Invention

This invention relates to a nonvolatile memory circuit formed in a semiconductor integrated circuit device, and more particularly to a nonvolatile memory circuit device having a sense amplifier for detecting memory data based on a difference between currents flowing through a dummy cell and a memory cell from which memory data is read out so as to perform a stable circuit operation in a wide range of power source voltage level.

2. Description of the Related Art

Figure 1:
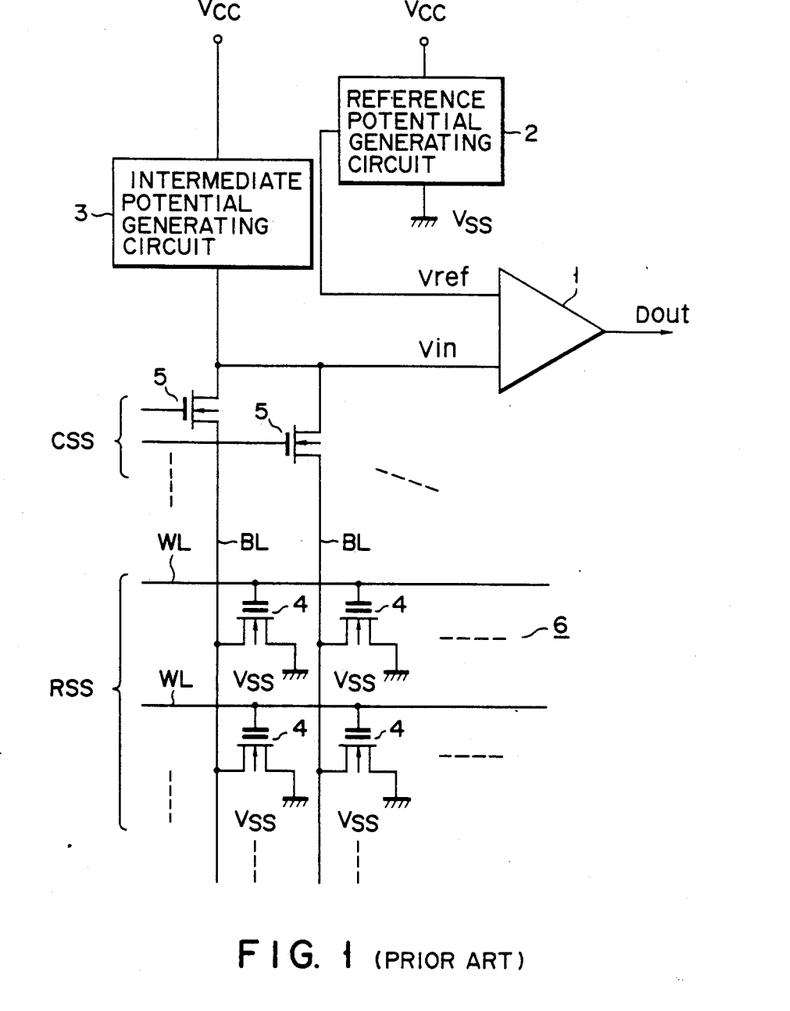
FIG. 1 is a circuit diagram of a readout circuit in the conventional nonvolatile memory circuit device.

Conventionally, the readout circuit of the nonvolatile memory circuit device is constituted as shown in FIG. 1, for example. Comparator 1 acting as a sense amplifier detects memory data by comparing reference potential Vref with readout signal potential Vin from a selected one of memory cells 4 in memory cell array 6 and outputs signal Dout corresponding to the memory data. Reference potential Vref is generated from reference potential generating circuit 2 and supplied to one input terminal of comparator 1. Intermediate potential generating circuit 3 generates intermediate potential $V_{DD}$ between power source potentials Vcc and Vss. Reference potential Vref is set to be slightly lower than potential $V_{DD}$. In the miniaturized memory cell, the memory cell may be damaged or erroneous programming operation will be effected if power source voltage Vcc is applied to the drain as it is in the data readout mode. In order to solve this problem, intermediate potential generating circuit 3 is used to suppress the drain potential to a minimum in the data readout mode. The output terminal of intermediate potential generating circuit 3 is connected to one end of the current path of each column selection transistor 5 and to the other input terminal of comparator 1. The other end of the current path of each column selection transistor 5 is connected to a corresponding one of bit lines BL. The gate of each column selection transistor 5 is supplied with column selection signal CSS from a column decoder (not shown). Word lines WL are arranged to intersect bit lines BL. Memory cells 4 each formed of a transistor of floating gate structure are disposed on the intersection of word lines WL and bit lines BL and arranged in a matrix form. The drain of each memory cell 4 is connected to bit line BL, the source thereof is connected to ground terminal Vss and the control gate thereof is connected to word line WL. Each word line WL is supplied with row selection signal RSS from a row decoder (not shown). Memory cell 4 of memory cell array 6 is selected based on column selection signal CSS and row selection signal RSS. The readout data from a selected one of memory cells 4 is supplied to the other input terminal of comparator 1 via bit line BL and the current path of column selection transistor 5. In the data readout mode, the drain of memory cell 4 is applied with potential $V_{DD}$ lower than power source potential Vcc from intermediate potential generating circuit 3. As a result, the potential amplitude of the readout data becomes smaller than in the case where power source potential Vcc is applied, and it is supplied to comparator 1 as readout signal potential Vin from memory cell 4.

However, since there are provided many analog circuits such as comparator 1, reference potential generating circuit 2 and intermediate potential generating circuit 3 in the circuit of FIG. 1, the range of the operation power source voltage level is narrow and the power consumption becomes large. In particular, since the potential amplitude of an input voltage applied to the other input terminal of comparator 1 is limited by intermediate potential generating circuit 3, it becomes necessary to constitute comparator 1 in the complex construction which is inherent to an analog circuit. With such a sense amplifier, the range of the operation power source voltage level is narrow, it is difficult to operate the sense amplifier at a low voltage and the power consumption becomes large.

SUMMARY OF THE INVENTION

An object of this invention is to provide a nonvolatile memory circuit device which can be stably operated in a wide range of power source voltage level.

Another object of this invention is to provide nonvolatile memory circuit device in which the power consumption can be lowered.

The above object can be attained by a nonvolatile memory circuit device comprising a plurality of memory cell transistors from which data is read out; a dummy cell transistor operated at the same time as the operation of a selected one of the memory cell transistors in the same condition as the selected memory cell transistor at the time of reading out data from the selected memory cell transistor, the source-drain current of the dummy cell transistor being set smaller than that of the memory cell transistors set in the non-programmed state and larger than that of the memory cell transistors set in the programmed state; and a sense amplifier including a logic gate circuit for converting the programming state of the memory cell transistor into a logic value based on a difference between the current characteristics of the memory cell transistor and the dummy cell transistor.

With the memory cell transistors and the dummy cell transistor having the above current characteristics, it becomes possible to use the logic gate circuit which can stably operate in a wide range of power source voltage level and whose power consumption can be suppressed.

Thus, a nonvolatile memory circuit device is provided which can be stably operated in a wide range of power source voltage level. In addition, a nonvolatile memory circuit device whose power consumption can be reduced is provided.

DETAILED DESCRIPTION OF THE PREFERRED EMBODIMENTS

Figure 2:
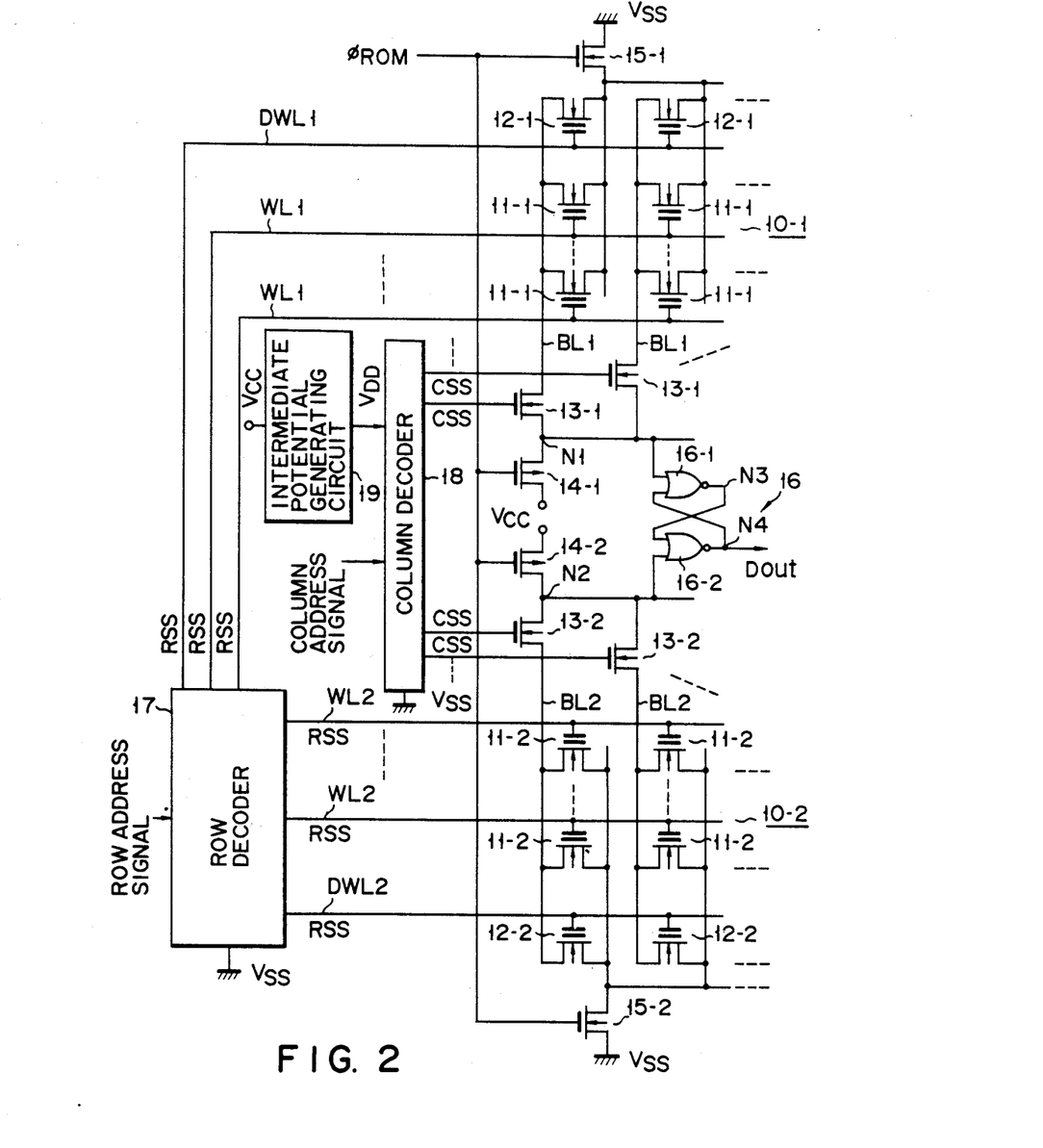
FIG. 2 is a circuit diagram of a readout circuit in a nonvolatile memory circuit device according to one embodiment of this invention.

FIG. 2 shows a readout circuit section in a nonvolatile memory circuit device according to one embodiment of this invention. First memory cell array 10-1 includes memory cells 11-1 from which data is read out and which are arranged in a matrix form. Dummy cell 12-1 is provided for each of columns of memory cells 11-1 in memory cell array 10-1. The source-drain current of dummy cell 12-1 flowing when it is turned on is set to be substantially ½ of the source-drain current of memory cell 10-1 flowing when it is turned on. The drains of transistors (memory cell transistors) used as memory cells 11-1 and transistors (dummy cell transistors) used as dummy cells 12-1 which are arranged on the same column are connected to the same bit line BL1. The control gates of memory cell transistors 11-1 arranged on the same row are connected to the same word line WL1. Likewise, the control gates of dummy cell transistors 12-1 are connected to dummy word line DWL1. The current paths of column selection transistors 13-1 of N-channel type are connected at one end to respective bit lines BL1. The other ends of the circuit paths of column selection transistors 13-1 are connected together. Further, the gates of column selection transistors 13-1 are connected to the output terminals of column decoder 18. The current path of precharging transistor 14-1 of P-channel type is connected between the common connection node (node N1) of the current paths of column selection transistors 13-1 and power source Vcc. The sources of memory cell transistors 11-1 and dummy cell transistors 12-1 are commonly connected, and the current path of discharging transistor 15-1 of N-channel type is connected between the source common connection node and ground terminal Vss. Control signal $\phi_{ROM}$ is supplied to the gates of precharging and discharging transistors 14-1 and 15-1 to control the conduction states thereof, thereby controlling the precharging/discharging operations.

Second memory cell array 10-2 is formed with substantially the same construction as first memory cell array 10-1, and memory cell transistors 11-2, dummy cell transistors 12-2, column selection transistors 13-2, precharging transistor 14-2, discharging transistor 15-2, bit lines BL2, word lines WL2 and dummy word line DWL2 of second memory cell array 10-2 are connected in the same manner as corresponding portions of first memory cell array 10-1. Two input terminals of sense amplifier 16 are respectively connected to nodes N1 and N2. sense amplifier 16 is formed of NOR gates 16-1 and 16-2 which are connected to constitute a flip-flop. That is, the first input terminal of NOR gate 16-1 is connected to node N1 and the second input terminal thereof is connected to the output terminal (node N4) of NOR gate 16-2. The first input terminal of NOR gate 16-2 is connected to node N2 and the second input terminal thereof is connected to the output terminal (node N3) of NOR gate 16-1. Data Dout is output from the output terminal of sense amplifier 16.

Word lines WL1 and WL2 and dummy word line DWL2 are selectively driven by row selection signal RSS output from row decoder 17. Row decoder 17 decodes a row address signal and outputs row selection signal RSS to selectively activate memory cell transistors 11-1, 11-2 and dummy cell transistors 12-1, 12-2. When one of memory cell transistors 11-1 of memory cell array 10-1 is selected, dummy cell transistor 12-2 of memory cell array 10-2 is selected, and when one of memory cell transistors 11-2 of memory cell array 10-2 is selected, dummy cell transistor 12-1 of memory cell array 10-1 is selected. The conduction states of column selection transistors 13-1, 13-2 are selectively controlled by column selection signals CSS output from column decoder 18. Column decoder 18 decodes a column address signal and outputs column selection signals CSS to simultaneously select column selection transistors 13-1 and 13-2 connected to respective bit lines BL1 and BL2 on corresponding rows of memory cell arrays 10-1 and 10-2. Further, column decoder 18 is operated on potential $V_{DD}$ generated from intermediate potential generating circuit 19 and generates column selection signal CSS of $V_{DD}$ level.

Figure 3A:
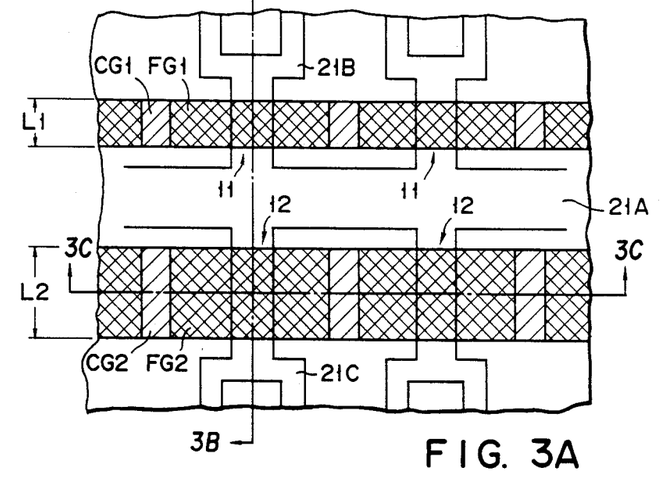
FIG. 3A is a pattern plan view showing the construction of memory cells and a dummy cell in the circuit of FIG. 2.
Figure 3B:
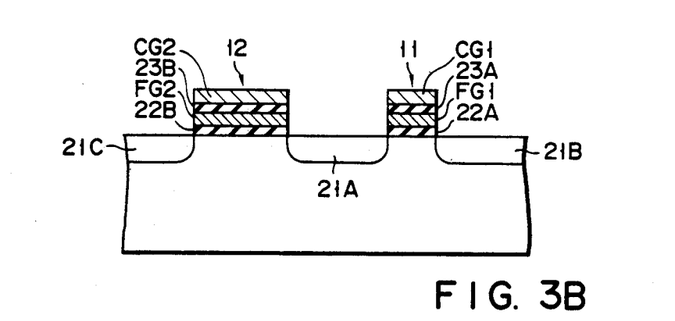
FIG. 3B is a cross sectional view of the pattern shown in FIG. 3A taken along line 3B—3B.
Figure 3C:
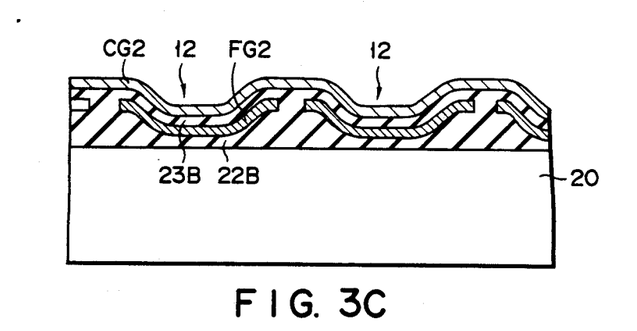
FIG. 3C is a cross sectional view of the pattern shown in FIG. 3 taken along line 3C—3C.

FIGS. 3A to 3C show the construction of memory cell transistors 11 (11-1 and 11-2) and dummy cell transistors 12 (12-1 and 12-2). FIG. 3A is a pattern plan view, FIG. 3B is a cross sectional view of a pattern shown in FIG. 3A taken along line 3B—3B, and FIG. 3C is a cross sectional view of the pattern shown in FIG. 3A taken along line 3C—3C. Memory cell transistors 11 and dummy cell transistors 12 are simultaneously formed in the same manufacturing process.

Common source region 21A of memory cell transistors 11 and dummy cell transistors 12, drain region 21B of memory cell transistors 11 and drain region 21C of dummy cell transistors 12 are separately formed with a preset distance in the surface area of P-type semiconductor substrate 20. Regions 21A, 21B and 21C are each formed of an N+-type impurity diffusion layer. Floating gates FG1 of memory cell transistors 11 are formed on first insulation films 22A which are in turn formed on those portions of substrate 20 which each lie between common source region 21A and drain region 21B. Second insulation film 23A is formed on floating gate FG1 and control gate CG1 of memory cell transistor 11 is formed on second insulation film 23A. Likewise, floating gates FG2 of dummy cell transistors 12 are formed on first insulation films 22B which are in turn formed on those portions of substrate 20 which each lie between common source region 21A and drain region 21C. Second insulation film 23B is formed on floating gate FG2 and control gate CG2 of dummy cell transistor 12 is formed on second insulation film 23B. Now, assume that the channel length of memory cell transistor 11 is L1 and the channel length of dummy cell transistor 12 is L2. Then, the channel lengths of transistors 11 and 12 are set to satisfy the relation of "L1<L2". The other dimensions of memory cell transistor 11 and dummy cell transistor 12 are the same.

Figure 4:
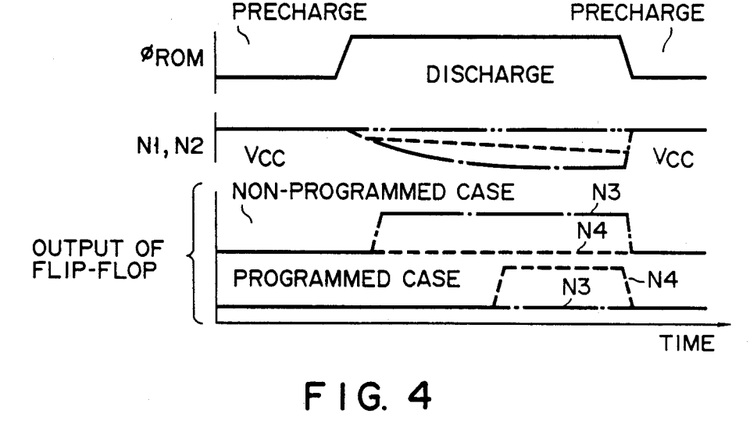
FIG. 4 is a timing chart showing variation in the potential of each node and control signal for controlling the precharging/discharging operation to illustrate the operation of the circuit shown in FIG. 2.

Next, the data readout operation of the memory circuit device shown in FIGS. 2 and 3A to 3C is explained with reference to FIG. 4. When signal $\phi_{ROM}$ is at "0" level, precharging transistors 14-1 and 14-2 are set in the ON state and discharging transistors 15-1 and 15-2 are set in the OFF state, thus precharging nodes N1 and N2 to power source potential Vcc. In this way, nodes N1 and N2 connected two input terminals of sense amplifier 16 are both set at a Vcc level or "1" level and therefore output data Dout of sense amplifier 16 is set at "0" level. At this time, since discharging transistors 15-1 and 15-2 are set in the OFF state, no D.C. penetration current will flow between power source terminals Vcc and Vss.

When signal $\phi_{ROM}$ is changed to "1" level, transistors 14-1 and 14-2 are turned off and transistors 15-1 and 15-2 are turned on, thereby setting the source potential of memory cell transistors 11-1, 11-2 and dummy cell transistors 12-1, 12-2 to ground potential Vss. Further, column selection transistors 13-1 and 13-2 on columns specified by a column address signal are selected and intermediate potential $V_{DD}$ is applied to the gates of selected transistors 13-1 and 13-2 to turn on the same. Since the gate potential of transistors 13-1 and 13-2 is set lower than power source potential Vcc, a potential lower than power source potential Vc will be applied to bit lines BL1 and BL2 connected to the current paths of column selection transistors 13-1 and 13-2. At this time, one of word lines WL1 and WL2 and one of dummy word lines DWL2 and DWL1 are selected by a row address signal. As a result, that one of memory cell transistors 11-1 and 11-2 which is arranged at the intersection between the selected bit line and the selected word line is selected. When one of memory cell transistors 11-1 of memory cell array 10-1 is selected, that one of dummy cell transistors 12-2 of memory cell array 10-2 which is connected to bit line BL2 of the same column is selected. In contrast, when one of memory cell transistors 11-2 of memory cell array 10-2 is selected, that one of dummy cell transistors 12-1 of memory cell array 10-1 which is connected to bit line BL1 of the same column is selected.

Assume now that one of memory cell transistors 11-1 of memory cell array 10-1 is selected and one of dummy cell transistors 12-2 of memory cell array 10-2 is selected. If selected memory cell transistor 11-1 has been programmed with a low threshold voltage, memory cell transistor 11-1 is turned on, discharging bit line BL1 and node N1 to ground potential Vss. If selected memory cell transistor 11-1 has been programmed with a high threshold voltage, memory cell transistor 11-1 is turned off, thus preventing bit line BL1 and node N1 from being discharged to ground potential Vss.

Assume that selected memory cell transistor 11-1 of memory cell array 10-1 has been programmed with a low threshold voltage and node N1 is discharged to ground potential Vss. In this case, since the source-drain current of dummy cell 12-2 of memory cell array 10-2 is set to be ½ of that of memory cell 11-1 of memory cell array 10-1, the potential of node N1 is set to ground potential Vss at a higher speed than the potential of node N2. As a result, output signal Dout of sense amplifier 16 is changed from "0" level to "1" level. In contrast, when the threshold voltage of memory cell 11-1 of memory cell array 10-1 is high, node N1 is not discharged and only node N2 is discharged. As a result, output Dout of sense amplifier 16 is kept at "0" level. In this way, data is read out from memory cell 11-1.

Also, when memory cell 11-2 of memory cell array 10-2 is selected and dummy cell 12-1 of memory cell array 10-1 is selected, data is read out in the same manner as described above.

There will now be explained the condition on the source-drain currents of memory cell transistors 11-1, 11-2 and dummy cell transistors 12-1, 12-2 required for attaining a stable readout operation in a wide range of power source voltage level. Assume that the source-drain current of a memory cell transistor in the nonprogrammed state (corresponding to "1") is I1, the source-drain current of a dummy cell transistor is I2 and the source-drain current of a memory cell transistor in the programmed state (corresponding to "0") is I3. In order to effect a correct readout operation, it is necessary to satisfy the current condition of "I1>I2>I3".

In order to satisfy the above current condition, the memory cell transistor and dummy cell transistor are formed with the pattern construction as shown in FIGS. 3A to 3C. In this case, channel lengths L1 and L2 are set as follows. That is, assuming that a voltage between the drain and source of the memory cell transistor and dummy cell transistor set while bit lines BL1 and BL2 are set in the precharged state is $V_{DS}$, the control gate voltage of the memory cell transistor and dummy cell transistor is Vcc, the channel width/channel length of the memory cell transistor is W0/L0, the channel width/channel length of the dummy cell transistor is Wd/Ld, the initial threshold voltage of the memory cell transistor and dummy cell transistor is Vth0 and variation in the threshold voltage of the memory cell transistor caused by data programming is ΔVth, the currents of the memory cell transistor and dummy cell transistor are derived as follows. In this case, β is a constant.

Current I1 flowing in the memory cell set in the non-programmed state is obtained as follows:

$$I1 = \beta \frac{W0}{L0} [(Vcc - Vth0) V_{DS} - \tfrac{1}{2} V_{DS}^2]$$

Current I3 flowing in the memory cell set in the programmed state is obtained as follows:

$$I3 = \beta \frac{W0}{L0} [(Vcc - Vth0 - \Delta Vth) V_{DS} - \tfrac{1}{2} V_{DS}^2]$$

Current I2 flowing in the dummy cell is obtained as follows:

$$I2 = \beta \frac{Wd}{Ld} [(Vcc - Vth0) V_{DS} - \tfrac{1}{2} V_{DS}^2]$$

In order to satisfy the current condition of "I1>I2", it is necessary to satisfy the relation of Wd/Ld<W0/L0, and in order to satisfy the current condition of "I3<I2", it is necessary to satisfy the following relation:

$$\frac{Wd}{Ld} > \frac{Vcc - Vth0 - \Delta Vth - \frac{1}{2}V_{DS}}{Vcc - Vth0 - \frac{1}{2}V_{DS}} \times \frac{W0}{L0}$$

When actual numeral values are used, for example, Vcc=8 V, Vth0=ΔVth=2 V and $V_{DS}$=5 V are used, the above current condition can be satisfied by setting the following relation:

$$\frac{Wd}{Ld} > \frac{8 - 2 - 2 - \frac{1}{2} \times 5}{8 - 2 - \frac{1}{2} \times 5} \times \frac{W0}{L0} = 0.43 \frac{W0}{L0}$$

As described above, it is preferable that the dimensional ratio (channel width/channel length) of the dummy cell transistor is set to be larger than 0.43 times the dimensional ratio of the memory cell transistor. In this case, the above current condition can be sufficiently satisfied by simply setting channel length L2 of dummy cell transistor 12 twice channel length L1 of memory cell transistor 11. Generally, it is sufficient to set channel length L2 of dummy cell transistor 12 1.5 to 3 times channel length L1 of memory cell transistor 11

Figure 5:
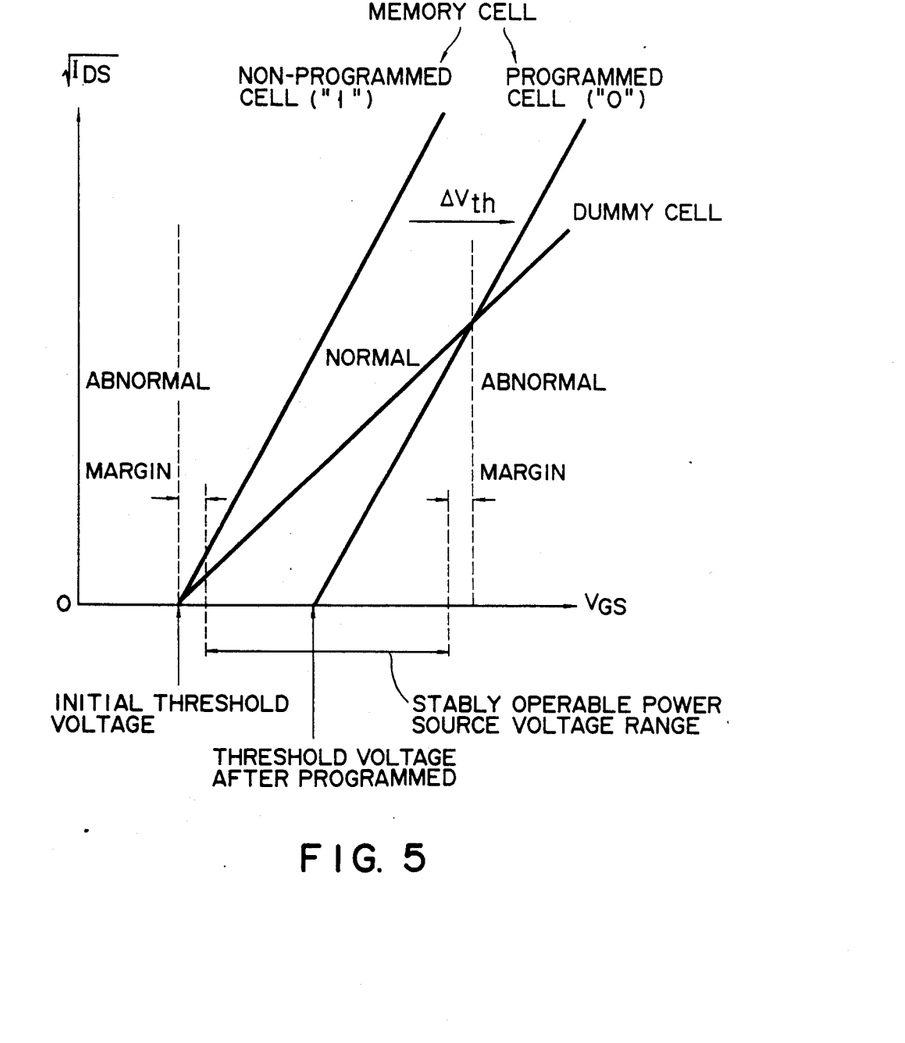
FIG. 5 is a diagram showing the characteristic of a drain-source current with respect to a voltage between the gate and source of the memory cell and dummy cell in the case where a pattern construction shown in FIGS. 3A to 3C is used.

Since the dummy cell transistor and memory cell transistor are formed in the same manufacturing process, the threshold voltages the initial threshold voltage in the voltage-current characteristic of each transistor) of the transistors are set to the same value as shown in FIG. 5. The voltage-current characteristic of a programmed memory cell corresponds to that obtained by shifting the voltage-current characteristic of a non-programmed transistor by the threshold voltage (ΔVth) of the transistor or several voltages. Assuming that the initial threshold voltage is 2 V, the current condition for the current flowing in each cell can be satisfied in a wide range of power source voltage level of 2 V to 7 V (corresponding to a stably operable power source voltage range shown in FIG. 5) even if shifted amount ΔVth of the threshold voltage of the programmed memory cell transistor is approx. 2 V. If the current relation of "I1>I2>I3" is set, the potential of that one of the two input terminals of sense amplifier 16 which is connected to the memory cell is quickly lowered in the case of non-programmed memory cell, and the potential of that one of the two input terminals of sense amplifier 16 which is connected to the dummy cell is quickly lowered in the case of programmed memory cell. In this way, the output state of sense amplifier 16 is determined according to the potential of the input terminal thereof which is more quickly lowered than the potential of the other input terminal.

Figure 6:
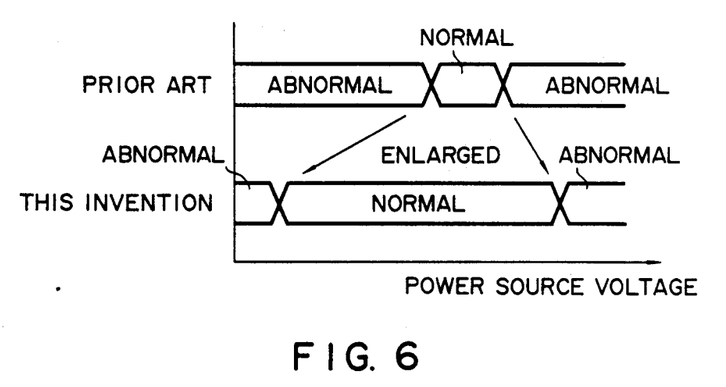
FIG. 6 is a diagram showing the range of operation power source voltage level of the nonvolatile memory circuit device of this invention in comparison with that of the conventional nonvolatile memory circuit device.

As described above, in the nonvolatile memory circuit device shown in FIGS. 2 and 3A to 3C, nodes N1 and N2 connected to the input terminals of sense amplifier 16 are precharged to power source potential Vcc by precharging transistors 14-1 and 14-2. After the memory cell and dummy cell are selected, data is read out while the source of each cell is being discharged via discharging transistors 15-1 and 15-2. Therefore, no D.C. penetration current will flow between power source terminals Vcc and Vss, thereby reducing the current consumption. Further, since nodes N1 and N2 connected to sense amplifier 16 are precharged to power source potential Vcc, the potential amplitudes of nodes N1 and N2 connected to the input terminals of sense amplifier 16 become sufficiently large. Therefore, a logic gate circuit whiCh has a wide range of operation power source voltage level, which can be operated at a low voltage and whose power consumption is small can be used as sense amplifier 16. For this reason, as shown in FIG. 6, the power source voltage margin of sense amplifier 16 can be enhanced, that is, the power source voltage range within which the correct operation can be ensured can be widened and at the same time the current consumption can be reduced. At this time, since potential $V_{DD}$ lower than power source potential Vcc is applied to the gate of column selection transistors 13-1 and 13-2, the drain potential of memory cell transistors 11-1, 11-2 and dummy cell transistors 12-1, 12-2 at the readout time can be kept low. Therefore, even in miniaturized memory cells, damage of the memory cells and an erroneous programming operation can be prevented. Further, since memory cell transistor 11 and dummy cell transistor 12 are formed in the same manufacturing process, the manufacturing process will not be complicated, the matching between the element characteristics of the transistors can be improved and the amplitude relation of currents can be stabilized against variation in the threshold voltage caused in the manufacturing process. In this case, since it is necessary to increase the channel length of only dummy cell transistors 12 and the channel length of memory cell transistors 11 occupying most area of the pattern can be set to a minimum permissible value in the pattern design, increase in the pattern area can be suppressed to a minimum.

Figure 7A:
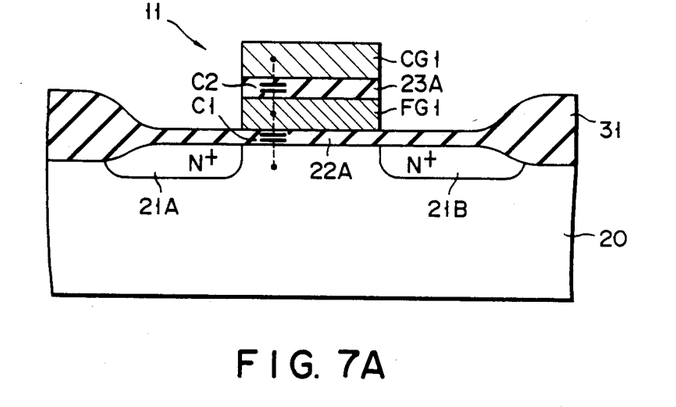
FIGS. 7A and 7B are cross sectional views showing the constructions of the memory cell transistor and dummy cell transistor in the circuit of FIG. 2 to illustrate another embodiment of this invention.
Figure 7B:
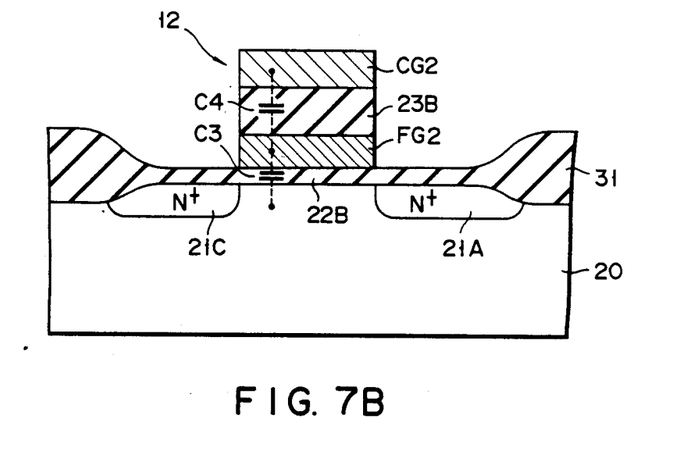

In the above embodiment, channel length L2 of dummy cell transistor 12 is set to be larger than channel length L1 of memory cell transistor 11. However, even if the coupling ratio of dummy cell transistor 12 is set to be smaller than that of memory cell transistor 11, the current driving abilities of memory cell transistor 11 and dummy cell transistor 12 can be changed so that the current condition of each cell transistor described before can be satisfied. For example, the capacitance between the control gate and floating gate of dummy cell transistor 12 is set to be smaller than that of memory cell transistor 11. Alternatively, channel length L1 of memory cell transistor 11 and channel length L2 of dummy cell transistor 12 are set equal to each other and the floating gate width of dummy cell transistor 12 is set to be smaller than that of memory cell transistor 11. In FIGS. 7A and 7B, the capacitance between the control gate and floating gate of dummy cell transistor 12 is set to be smaller than that of memory cell transistor 11, and in FIGS. 8A and 8B, the floating gate width of dummy cell transistor 12 is set to be larger than that of memory cell transistor 11.

Figure 9A:
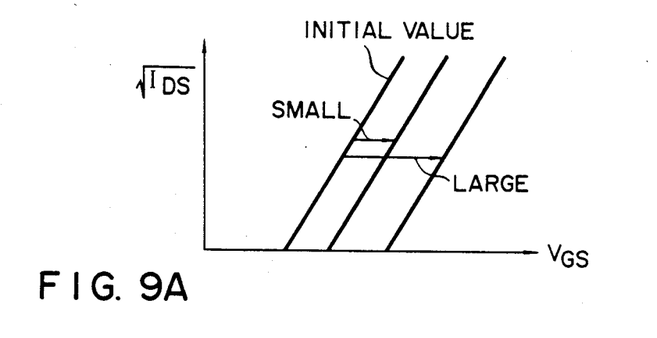
FIG. 9A is a voltage-current characteristic diagram showing variation in the threshold voltage of the memory cell transistor by the programming operation.
Figure 9B:
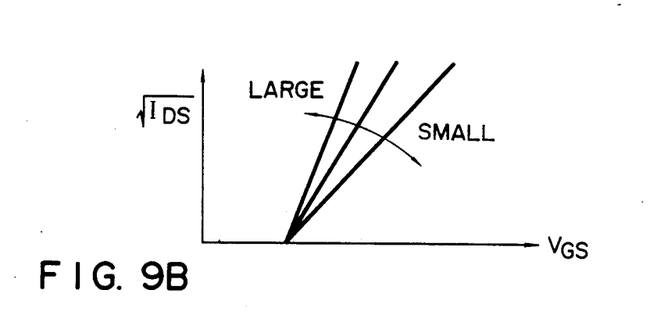
FIG. 9B is a voltage-current characteristic diagram obtained in a case where the coupling ratios of the memory cell transistor and the dummy cell transistor are set to the sam value and the ratios of the channel width/channel length of the memory cell transistor and the dummy cell transistor are varied.
Figure 9C:
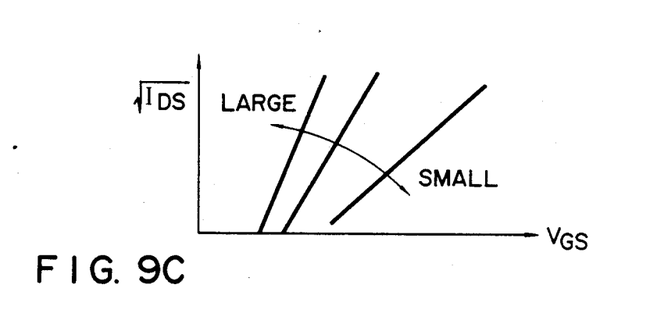
FIG. 9C is a voltage-current characteristic diagram obtained in a case where the ratios of the channel width/channel length of the memory cell transistor and the dummy cell transistor are set to the same value and the coupling ratios of the memory cell transistor and the dummy cell transistor are varied.

Now, the voltage-current characteristic of the cell transistor is explained in a case where W/L is changed and in a case where the coupling ratio is changed. Assume that the drain-source current of the cell transistor is $I_{DS}$ and a voltage between the gate and source is $V_{GS}$. Then, variation ΔVth in the threshold voltage caused by programming data into the memory cell is obtained as shown in FIG. 9A. In a case where W/L of memory cell transistor 11 and dummy cell transistor 12 is changed with the coupling ratio kept at the same value, the voltage-current characteristic shown in FIG. 9B is obtained. In a case where the coupling ratio is changed with W/L of memory cell transistor 11 and dummy cell transistor 12 kept unchanged, the voltagecurrent characteristic shown in FIG. 9C is obtained.

Now, an embodiment in which the coupling ratio is changed is explained. FIGS. 7A and 7B show other constructions of memory cell transistor 11 and dummy cell transistor 12 formed in order to satisfy the current condition of "I1>I2>I3" of the cell transistors. FIG. 7A shows a cross section of memory cell transistor 11 (11-1, 11-2) in the circuit of FIG. 2, and FIG. 7B shows a cross section of dummy cell transistor 12 (12-1, 12-2). In FIGS. 7A and 7B, one of the memory cell transistors and one of the dummy cell transistors are shown, and the transistors are formed in element areas separated from each other by field oxide film 31 formed in semiconductor substrate 20. Further, memory cell transistor 11 and dummy cell transistor 12 are formed with the same channel length and channel width. In addition, capacitor C1 of memory cell transistor 11 is formed between floating gate FG1 and substrate 20, and capacitor C2 of memory cell transistor 11 is formed between control gate CG1 and floating gate FG1. The coupling ratio of the memory cell transistor is expressed by C2/C1. Likewise, capacitor C3 of dummy cell transistor 12 is formed between floating gate FG2 and substrate 20, and capacitor C4 of dummy cell transistor 12 is formed between control gate CG2 and floating gate FG2. The coupling ratio of the dummy cell transistor is expressed by C4/C3. The film thickness of insulation film 22A between floating gate FG1 of memory cell transistor 11 and substrate 20 is equal to that of insulation film 22B between floating gate FG2 of dummy cell transistor 12 and substrate 20. Further, the film thickness of insulation film 23B between control gate CG2 and floating gate FG2 of dummy cell transistor 12 is formed thicker than that of insulation film 23A between control gate CG1 and floating gate FG1 of memory cell transistor 11. Therefore, the relations of "C1=C3" and "C2>C4" can be obtained. As a result, the coupling ratio of dummy cell transistor 12 becomes smaller than that of memory cell transistor 11. That is, the relation of "C4/C3<C2/C1" is obtained.

The above-described current condition of memory cell transistor 11 and dummy cell transistor 12 can be satisfied by properly setting the coupling ratios. Therefore, the same effect as described in the former embodiment can be obtained. However, since insulation films 23A and 23B of memory cell transistor 11 and dummy cell transistor 12 cannot be formed in the same manufacturing step, it is necessary to form them in different manufacturing steps.

Figure 8A:
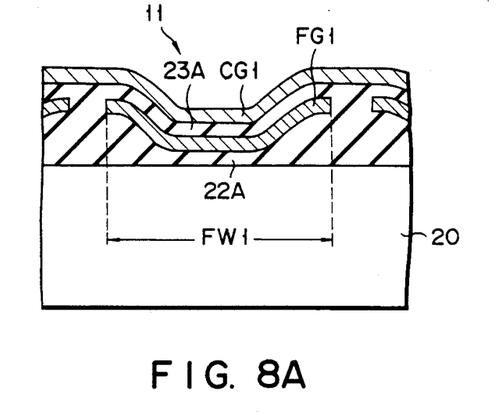
FIGS. 8A and 8B are cross sectional views showing the constructions of the dummy cell transistor and memory cell transistor in the circuit of FIG. 2 to illustrate still another embodiment of this invention.
Figure 8B:
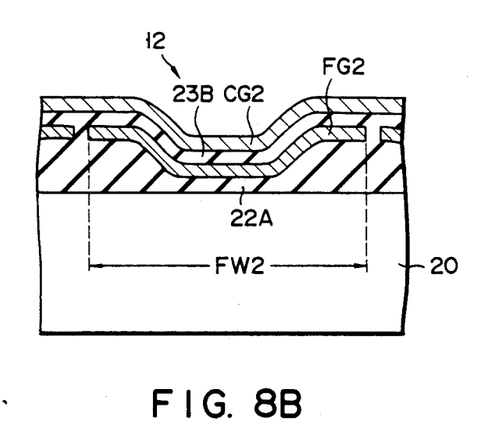

FIGS. 8A and 8B show another example of the construction of the memory cell transistor and dummy cell transistor which are so formed as to satisfy the current condition of "I1>I2>I3" for each of the cell transistors. FIG. 8B shows a cross section of memory cell transistor 11 in the circuit of FIG. 2 and FIG. 8A shows a cross section of dummy cell transistor 12. The channel lengths of memory cell transistor 11 and dummy cell transistor 12 are set equal to each other and the thicknesses of insulation films 22A and 23A of memory cell transistor 11 are set equal to those of insulation film 22B and 23B of dummy cell transistor 12. Width FW1 of floating gate FG1 of dummy cell transistor 12 is set to be smaller than width FW2 of floating gate FG2 of memory cell transistor 11. With this construction, capacitance C2 is set to be larger than capacitance C4. The other element dimensions are set to equal to each other. Therefore, the relations of "C3=C1" and "C2>C4" are obtained. As a result, the coupling ratio of dummy cell transistor 12 is set smaller than that of memory cell transistor 11 as in the construction shown in FIGS. 7A and 7B. That is, the relation of "C4/C3<C2/C1" is obtained.

As described above, the current driving ability of the dummy cell transistor can be set smaller than that of the memory cell transistor by changing the coupling ratios of the cell transistors as well as by changing the channel lengths of the cell transistors. Thus, the relation of "I1>I2>I3" can be obtained without fail and the same effect as is obtained in the former embodiment can be obtained.

Further, in the above embodiment, either the channel lengths or the coupling ratios of the memory cell transistor and dummy cell transistor are changed, but it is of course possible to change both the channel lengths and the coupling ratios thereof.

What is claimed is:

1. An electrically programmable nonvolatile memory circuit device comprising:

a plurality of memory cell transistors from which data is read out, each of said memory cell transistors having a control gate, a floating gate, a source, and a drain;

a dummy cell transistor having a control gate, a floating gate, a source, and a drain, and being operated at the same time as the operation of a selected one of said memory cell transistors, with the control gate of said dummy cell transistor being supplied with the same potential as that applied to the control gate of the selected memory cell transistor, and with the drain of said dummy cell transistor being supplied with the same potential as that applied to the drain of the selected memory cell transistor;

a source-drain current of said dummy cell transistor being set to an intermediate level between a source-drain current of said memory cell transistors in a non-programmed state and said memory cell transistors in a programmed state; and sense amplifier means including a logic gate circuit for converting the programming state of the memory cell transistor into a logic value based on a difference between the current characteristics of said memory cell transistor and said dummy cell transistor, for amplifying memory data of said memory cell transistor.

2. A nonvolatile memory circuit device according to claim 1, wherein a ratio of the channel width/channel length of said dummy cell transistor is set to ⅔ to ⅓ times that of said memory cell transistor.

3. A nonvolatile memory circuit device according to claim 1, wherein a channel width of said dummy cell transistor is equal to that of said memory cell transistor and a channel length of said dummy cell transistor is set to 1.5 to 3 times that of said memory cell transistor.

4. A nonvolatile memory circuit device according to claim 1, wherein a coupling ratio of a first capacitor between the control gate and the floating gate of said dummy cell transistor to a second capacitor between the floating gate thereof and a semiconductor substrate is set smaller than a coupling ratio of a third capacitor between the control gate and the floating gate of said memory cell transistor to a fourth capacitor between the floating gate thereof and said semiconductor substrate.

5. A nonvolatile memory circuit device according to claim 4, wherein a gate insulation film between the control gate and floating gate of said dummy cell transistor is formed thicker than that between the control gate and floating gate of said memory cell transistor.

6. A nonvolatile memory circuit device according to claim 4, wherein the floating gate of said dummy cell transistor is formed narrower than that of said memory cell transistor.

7. A nonvolatile memory circuit device according to claim 1, wherein said logic gate circuit included in said sense amplifier includes a flip-flop.

8. An electrically programmable nonvolatile memory circuit device comprising:
   a first memory cell array having a plurality of first memory cell transistors formed in a matrix form;
   first word lines connected to respective rows of said first memory cell transistors constituting said first memory cell array;
   first dummy cell transistors arranged adjacent to said first memory cell array; a source-drain current of said first dummy cell transistors being set to an intermediate level between a source-drain current of said first memory cell transistors in a non-programmed state and said first memory cell transistors in a programmed state;
   a first dummy word line connected to said first dummy cell transistors;
   first bit lines connected to respective columns of said first memory cell transistors constituting said first memory cell array and said first dummy cell transistors, respectively;
   first column selection means connected to said first bit lines, for selecting one of said first bit lines;
   first precharging means for precharging one of said first bit lines selected by said first column selection means, said first precharging means being set operative prior to the data readout operation to effect the precharging operation and set non-operative at the data readout time;
   first discharging means for discharging said first bit lines, said first discharging means being set to discharge said first bit lines at the data readout time and set non-operative while said first precharging means is effecting the precharging operation;
   a second memory cell array having a plurality of second memory cell transistors formed in a matrix form;
   second word lines connected to respective rows of said second memory cell transistors constituting said second memory cell array;
   second dummy cell transistors arranged adjacent to said second memory cell array, a source-drain current of said second dummy cell transistors being set to an intermediate level between a source-drain current of said second memory cell transistors in a non-programmed state and said second memory cell transistors in a programmed state;
   a second dummy word line connected to said second dummy cell transistors;
   second bit lines connected to respective columns of said second memory cell transistors constituting said second memory cell array and aid second dummy cell transistors, respectively;
   second column selection means connected to said second bit lines, for selecting one of said second bit lines;
   second precharging means for precharging one of said second bit lines selected by said second column selection means, said second precharging means being set operative prior to the data readout operation to effect the precharging operation and set non-operative at the data readout time;
   second discharging means for discharging said second bit lines, said second discharging means being set to discharge said second bit lines at the data readout time and set non-operative while said second precharging means is effecting the precharging operation;
   row decoder means for selectively driving said first and second word lines and said first and second dummy word lines;
   said row decoder means driving said second dummy word line when said first word line is driven and driving said first dummy word line when the second word line is driven;
   column decoder means for controlling said first and second column selection means to select said first and second bit lines, said column decoder means outputting a signal lower than a power source voltage to simultaneously select corresponding columns of said first and second memory cell arrays; and
   sense amplifier means having a first input terminal connected to an output terminal of said first precharging means and a second input terminal connected to the output terminal of said second precharging means and including a logic gate circuit for converting the programming state of said first and second memory cell transistors into a logic value based on a difference between the current characteristics of said first and second memory cell transistors and said first and second dummy cell transistors, for amplifying memory data of said first and second memory cell transistors.

9. A nonvolatile memory circuit device according to claim 8, wherein ratios of the channel width/channel length of said first and second dummy cell transistors are respectively set to ⅔ to ¼ times those of said first and second memory cell transistors.

10. A nonvolatile memory circuit device according to claim 8, wherein channel widths of said first and second dummy cell transistors are equal to those of said first and second memory cell transistors and channel lengths of said first and second dummy cell transistors are respectively set to 1.5 to 3 times those of said first and second memory cell transistors.

11. A nonvolatile memory circuit device according to claim 8, wherein a coupling ratio of a first capacitor between a control gate and a floating gate of each of said first and second dummy cell transistors to a second capacitor between the floating gate thereof and a semiconductor substrate is set smaller than a coupling ratio of a third capacitor between the control gate and floating gate of each of said first and second memory cell transistors to a fourth capacitor between the floating gate thereof and said semiconductor substrate.

12. A nonvolatile memory circuit device according to claim 11, wherein a gate insulation film between the control gate and floating gate of each of said first and second dummy cell transistors is formed thicker than that between the control gate and floating gate of each of said first and second memory cell transistors.

13. A nonvolatile memory circuit device according to claim 11, wherein the floating gate of each of said first and second dummy cell transistors is formed wider than that of each of said first and second memory cell transistors.

14. A nonvolatile memory circuit device according to claim 8, wherein said logic gate circuit included in said sense amplifier includes flip-flop.

* * * * *

UNITED STATES PATENT AND TRADEMARK OFFICE
CERTIFICATE OF CORRECTION

PATENT NO. : 4,972,378

DATED : November 20, 1990

INVENTOR(S) : Nobutaka Kitagawa et al

It is certified that error appears in the above-identified patent and that said Letters Patent is hereby corrected as shown below:

Column 2, line 60, change "." to --;-- after "2".

Column 2, line 64, change "FIG 3" to --FIG. 3A --.

Claim 8, column 11, line 60, change "aid" to --said--.

Claim 14, column 12, line 67, insert --a-- after "includes".

Signed and Sealed this

Sixteenth Day of March, 1993

Attest:

STEPHEN G. KUNIN

*Attesting Officer*     Acting Commissioner of Patents and Trademarks